United States Patent [19]

Anthony et al.

[11] Patent Number: 4,981,818

[45] Date of Patent: Jan. 1, 1991

[54] POLYCRYSTALLINE CVD DIAMOND SUBSTRATE FOR SINGLE CRYSTAL EPITAXIAL GROWTH OF SEMICONDUCTORS

[75] Inventors: Thomas R. Anthony, Schenectady; James F. Fleischer, Scotia, both of N.Y.

[73] Assignee: General Electric Company, Worthington, Ohio

[21] Appl. No.: 479,486

[22] Filed: Feb. 13, 1990

[51] Int. Cl.$^5$ ............... H01L 21/00; H01L 21/02; H01L 23/36; C30B 29/04
[52] U.S. Cl. ......................... 437/233; 437/100; 437/103; 437/126; 437/974; 148/DIG. 135; 357/81; 427/69
[58] Field of Search ............ 437/225, 228, 233, 100, 437/103, 126, 974; 204/192.15, 192.22, 192.31; 427/69, 70, 96, 99; 148/DIG. 135; 357/81

[56] References Cited

FOREIGN PATENT DOCUMENTS 0251158  11/1986  Japan ........................................ 357/81

OTHER PUBLICATIONS

Phillips, R., Integrated Semiconductor Structure Arrangement, IBM Tech. Dis. Bull., vol. 8, No. 7, Dec. 1965, p. 1013.
Dyment, J. C., Continuous Operation of GaAs Junction Lasers on Diamond Heat Sinks at 200° K., Appl. Phys. Lett., vol. 11, No. 9, Nov. 1, 1967, pp. 292–294.

*Primary Examiner*—Brian E. Hearn
*Assistant Examiner*—B. Everhart
*Attorney, Agent, or Firm*—Mueller and Smith

[57] ABSTRACT

The present invention is directed towards the production of a single crystal semiconductor device mounted in intimate contact with a polycrystalline CVD diamond substrate which allows the high heat conductivity of diamond to keep the device cool. This device is made by a method comprising the steps of placing in a reaction chamber, a single crystal of silicon heated to an elevated CVD diamond-forming temperature. A hydrocarbon/hydrogen gaseous mixture is provided within the chamber and is at least partially decomposed to form a polycrystalline CVD diamond layer on said silicon. During the deposition/growth phase, an intermediate layer of single crystal SiC has been found to form between the single crystal of silicon and the polycrystalline CVD diamond layer. In the next step of the process, the silicon is etched or removed to reveal the single crystal SiC supported by the polycrystalline CVD diamond layer. Finally, a semiconductor layer (e.g. silicon, SiC, GaAs, or the like) is grown on the exposed single crystal of SiC to produce a single crystal semiconductor polycrystalline CVD diamond mounted device.

9 Claims, No Drawings

POLYCRYSTALLINE CVD DIAMOND SUBSTRATE FOR SINGLE CRYSTAL EPITAXIAL GROWTH OF SEMICONDUCTORS

BACKGROUND OF THE INVENTION

The present invention relates to the preparation of single crystal semiconductor wafers and more particularly to utilizing and producing a polycrystalline CVD diamond substrate therefor.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide support in cylindrical or annular form, extended the product line for diamond additionally. However, the requirement of high pressure and high temperature has been a limitation in product configuration, for example.

Recently, industrial efforted directed toward the growth of diamond at low pressures, where it is metastable, has increased dramatically. Although the ability to produce diamond by low-pressure synthesis techniques has been known for decades, drawbacks including extremely low growth rates prevented wide commercial acceptance. Recent developments have led to higher growth rates, thus spurring recent industrial interest in the field. Additionally, the discovery of an entirely new class of solids, known as "diamond like" carbons and hydrocarbons, is an outgrowthh of such recent work.

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1750° to 2400° C. The gas mixture disassociates at the filament surface and diamonds are condensed onto a heated substrate placed just below the hot tungsten filament. The substrate is held in a resistance heated boat (often molybdenum) and heated to a temperature in the region of about 500° to 1100° C.

The second technique involves the imposition of a plasma discharge to the foregoing filament process. The plasma discharge serves to increase the nucleation density, growth rate, and it is believed to enhance formation of diamonds films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching network to electrically couple electrical energy to the generated plasma. Additionally, the diamond growth rate offered by these two systems can be quite modest.

In the semiconductor arena, doping polycrystalline CVD diamond with boron, aluminum, lithium, phosphorous, or the like to produce an n-type or p-type semiconductor device is known. Representative art in this regard include U.S. Pats. Nos. 3,636,077, 3,636,078, 3,636,079, and 4,767,608, and European Patent Publication No. 286,306. EP Patent Publication 282,054 expands on such semiconductor technology by coating a single crystal substrate of silicon or GaAs with an intermediate SiC layer upon which is deposited CVD diamond as a single crystal. This single crystal diamond can be doped with boron, phosphorous, or sulfur, for example. This publication reports that directly growing CVD diamond on a single crystal silicon substrate results in the production of polycrystalline CVD diamond, rather than single crystal diamond, and hence is a process not suitable for semiconductor production.

BROAD STATEMENT OF THE INVENTION

The presennt invention is directed towards the production of a single crystal semiconductor device mounted in intimate contact with a polycrystalline CVD diamond substrate which allows the high heat conductivity of diamond to keep the device cool. This device is made by a method comprising the steps of placing in a reaction chamber, a single crystal of silicon heated to an elevated CVD diamond-forming temperature. A hydrocarbon/hydrogen gaseous mixture is provided within the chamber and is at least partially decomposed to form a polycrystalline CVD diamond layer on said silicon. During this deposition/growth phase, an intermediate layer of single crystal SiC has been found to form between the single crystal of silicon and the polycrystalline CVD diamond layer. In the next step of the process, the silicon is etched or removed to reveal the single crystal SiC supported by the polycrystalline CVD diamond layer. Finally, a semiconductor layer (e.g. silicon, SiC, GaAs, or the like) is grown on the exposed single crystal of SiC to produce a single crystal semiconductor polycrystalline CVD diamond mounted device.

Advantages of the present invention include the ability to grow a single crystal of semiconductor material which is in intimate contact with a polycrystalline diamond layer, thus allowing the high heat conductivity of diamond to keep the device cool. Another advantage is the ability to make semiconductor devices that have the effective thermal conductivity of diamond, but which have the electrical and processing characteristics of the semiconductor wafer material. These and other advantages will be readily apparent to those skilled in the art based upon the disclosure contained herein.

DETAILED DESCRIPTION OF THE INVENTION

CVD diamond grows as a polycrystalline film with a grain size typically ranging from about 50 microns to sub-micron grain size. For some applications, such as the growth of single crystal semiconductor material on diamond substrates, the polycrystalline nature of CVD diamond prevents the growth of semiconductor single crystals. As stated above, the ability to mount a semiconductor device in intimate contact with diamond allows the high heat conductivity of diamond to keep the device cool. For some applications such as high power GaAs devices, this heat resistance of the wafer is the limiting property of the device. The problem, then, is to devise a procedure whereby single crystal semiconductor material can be grown/deposited on polycrystalline CVD diamond.

Apparently, prior investigators have failed to appreciate the fact that when CVD diamond is grown directly in a single crystal of silicon, that a thin transition layer of SiC (about 5–100 atoms thick) forms between the diamond and the silicon wafer. This transition layer of SiC is a single crystal. Once this discovery is made and appreciated, those skilled in the art will readily appreciate the remaining steps of the process and its flexibility in permitting single crystal semiconductor wafers to be mounted/grown directly on polycrystalline CVD diamond substrate.

With respect to conventional CVD processes useful in the present invention, hydrocarbon/hydrogen gaseous mixtures are fed into a CVD reactor as an initial step. Hydrocarbon sources can include the methane series gases, e.g. methane, ethane, propane; unsaturated hydrocarbons, e.g. ethylene, acetylene, cyclohexene, and benzene; and the like. Methane, however, is preferred. The molar ratio of hydrocarbon to hydrogen broadly ranges from about 1:10 to about 1:1,000 with about 1:100 being preferred. This gaseuous mixture optionally may be diluted with an inert gas, e.g. argon. The gaseous mixture is at least partially decomposed thermally by one of several techniques known in the art. One of these techniques involves the use of a hot filament which normally is formed of tungsten, molydenum, tantalum, or alloys thereof. U.S. Pat. No. 4,707,384 illustrates this process.

The gaseous mixture partial decomposition also can be conducted with the assistance of d.c. discharge or radio frequency electromagnetic radiation to generate a plasma, such as proposed in U.S. Pats. Nos. 4,749,587, 4,767,608, and 4,830,702; and U.S. Pat. No. 4,434,488 with respect to use of microwaves. The substrate may be bombarded with electrons during the CVD deposition process in accordance with U.S. Pat. No. 4,740,263.

Regardless of the particular method used in generating the partially decomposed gaseous mixture, the substrate is maintained at an elevated CVD diamond-forming temperature which typically ranges from about 500° to 1100° C. and preferably in the range of about 850° to 950° C. where diamond growth is at its highest rate in order to minimize grain size. Pressures in the range of from about 0.01 to 1000 Torr, advantageously about 100–800 Torr, are taught in the art, with reduced pressure being preferred. Details on CVD processes additionally can be reviewed by reference to Angus, et al., "Low-Pressure, Metastable Growth of Diamond and 'Diamondlike' Phases", *Science*, vol. 241, pages 913–921 (Aug. 19, 1988); and Bachmann, et al., "Diamond Thin Films", *Chemical and Engineering News*, pp. 24–39 (May. 15, 1989).

The thickness of the polycrystalline CVD layer grown/deposited on the silicon wafer preferably should be self-supporting and of sufficient thickness that it meets the heat conductivity requirements of the ultimate semiconductor device. In this regard, it will be appreciated that useful CVD diamond layer thicknesses often will range from about 10 to 1,000 micrometers with about 100 to 300 micrometers being typical. Once the desired thickness of the CVD diamond layer has been reached, the CVD process is terminated.

The next step of the process involves the selective removal of silicon from the silicon-SiC-diamond laminate structure that has been formed. Care must be exercised that silicon is etched or removed, but not the single crystal SiC intermediate layer. Etch solutions suitable for this purpose include, for example:

Ternary mixtures of HF, $HNO_2$ and $H_2O$ (1:3:1 molar ratio), 10 micron/min etch rate, Binary mixtures of HF and $HNO_3$ (1:3 molar ratio), 20 microns/min etch rate, Ternary mixture of HF, $HNO_3$ and $CH_3COOH$ (3:5:3 molar ratio), 25 micron/min etch rate.

Now, with the single crystal layer of SiC revealed, albeit only angstroms in thickness, a conventional semiconductor material now can be grown/deposited on this layer for producing single crystal epitaxial semiconductor growth. Silicon, SiC, GaAs, and the like can be epitaxially grown on the thin single crystal of SiC to produce a single crystal active layer of the semiconductor material which now is in intimate contact with the diamond layer, allowing the high heat conductivity of diamond to keep the device cool. The growth of such semi-conductor materials is well known in the art and little more concerning this steps of the process need be detailed here, e.g. see J.L. Vossen and W. Kern, *Thin Film Processes, Handbook of Thin Film Technology*, edited by L.I. Massel and R. Glang, McGraw-Hill Book Company, New York, N.Y. (1970). All references herein are expressly incorporated herein by reference.

We claim:

1. A method for forming a single crystal semiconductor device which comprises the steps of:
   (a) placing in a reaction chamber a single crystal of silicon heated to an elevated CVD diamond-forming temperature;
   (b) providing a hydrocarbon/hydrogen gaseous mixture within said chamber;
   (c) at least partially decomposing said gaseous mixture is said chamber to form a polycrystalline CVD diamond layer in said silicon, an intermediate layer of single crystal SiC forming therebetween;
   (d) removing said silicon to reveal said single crystal SiC supported by said polycrystalline CVD diamond; and
   (e) growing a semiconductor layer on said single crystal SiC to produce a single crystal semiconductor polycrystalline CVD diamond device.

2. The method of claim 1 wherein the molar ratio of hydrocarbon to hydrogen in said gaseous mixture ranges from between about 1:10 and 1:1,000.

3. The method of claim 2 wherein said gaseous mixture additionally comprises an inert gas.

4. The method of claim 1 wherein said pressure ranges from between about 0.01 and 1,000 Torr.

5. The method of claim 1 wherein said single crystal of silicon is heated to an elevated CVD diamond-forming temperature ranging from between about 500° and 1100° C.

6. The method of claim 1 wherein said hydrocarbon of said gaseous mixture comprises methane.

7. The method of claim 1 wherein said silicon is removed by an etching solution.

8. The method of claim 1 wherein the thickness of said polycrystalline CVD diamond layer ranges from between about 10 to 1,000 micrometers.

9. The method of claim 1 wherein said semiconductor layer grown on said single crystal of SiC is selected from the group consisting of silicon, SiC, and GaAs.

* * * * *